(12) United States Patent
Ryu

(10) Patent No.: US 8,053,148 B2
(45) Date of Patent: Nov. 8, 2011

(54) METHOD FOR FABRICATING PHOTOMASK

(75) Inventor: Jin Ho Ryu, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 155 days.

(21) Appl. No.: 12/346,517

(22) Filed: Dec. 30, 2008

(65) Prior Publication Data

US 2009/0239157 A1    Sep. 24, 2009

(30) Foreign Application Priority Data

Mar. 18, 2008 (KR) .................. 10-2008-0024992

(51) Int. Cl.
*G03F 1/00* (2006.01)

(52) U.S. Cl. .............. 430/5; 430/311; 430/394

(58) Field of Classification Search ............. 430/5, 311, 430/394

See application file for complete search history.

(56) References Cited

U.S. PATENT DOCUMENTS

| | | | |
|---|---|---|---|
| 6,312,857 B1 * | 11/2001 | Nakagawa et al. | 430/5 |
| 6,492,075 B1 * | 12/2002 | Templeton et al. | 430/5 |
| 2005/0170655 A1 | 8/2005 | Bencher et al. | |
| 2005/0266319 A1 * | 12/2005 | Miyake et al. | 430/5 |
| 2007/0275307 A1 * | 11/2007 | Hada et al. | 430/5 |
| 2008/0050659 A1 * | 2/2008 | Ohtake et al. | 430/5 |
| 2008/0057411 A1 * | 3/2008 | Carpenter et al. | 430/5 |
| 2008/0193863 A1 * | 8/2008 | Shin et al. | 430/5 |
| 2009/0053620 A1 * | 2/2009 | Ha | 430/5 |

FOREIGN PATENT DOCUMENTS

| | | |
|---|---|---|
| JP | 05-243144 | 9/1993 |
| KR | 1020060074485 A | 7/2006 |

OTHER PUBLICATIONS

A. J. Varghese et al., "Thymine-Thymine Adduct as a Photoproduct of Thymine", Science, vol. 160, Apr. 12, 1968.
Jin Ho Ryu et al., "Triad base pairs containing fluorine unit for quencher-free SNP typing", Tetrahedon (2007), doi: 10.1016/j.tet.2006.10.091.

* cited by examiner

*Primary Examiner* — Mark F Huff
*Assistant Examiner* — Rashid Alam
(74) *Attorney, Agent, or Firm* — Kilpatrick Townsend & Stockton LLP

(57) ABSTRACT

Provided is a method for fabricating a photomask. A light blocking layer is formed on a transparent substrate having a first region and a second region. A hard mask layer is formed on the light blocking layer. A first polymer film is formed on the hard mask layer. Here, the first polymer film is formed of single strand polymers that can form a complementary binding. A portion of the first polymer film corresponding to the first region is changed to comprise polymers having partial complementary binding. A hard mask pattern for exposing a portion of the light blocking layer under the first polymer film is formed by performing an etching process using the changed portion as an etch stop. A light blocking pattern is formed by removing an exposed portion of the light blocking layer by performing an etching process using the hard mask pattern as an etch mask, and then removing the hard mask pattern.

25 Claims, 7 Drawing Sheets

METHOD FOR FABRICATING PHOTOMASK

CROSS-REFERENCE TO RELATED APPLICATIONS

The present application claims priority to Korean patent application number 10-2008-0024992, filed on Mar. 18, 2008, the disclosure of which is incorporated by reference in its entirety.

BACKGROUND

The invention relates to a method for fabricating a photomask, and more particularly, to a method for fabricating a photomask using a polymer.

A semiconductor memory device includes a variety of patterns. These patterns are formed through a photolithography including an exposure process, a development process, and an etching process using a photoresist pattern formed by the photolithography as an etch mask. The exposure process is a process for transferring a pattern on a photomask to a photoresist layer on a wafer. Therefore, if the pattern on the photomask is not formed correctly, a desired photoresist pattern cannot be formed correctly.

Recently, as semiconductor memory devices become more highly integrated, the patterns of the semiconductor memory devices become finer. Therefore, the patterns on the photomasks also become finer. An electron-beam lithography is widely used as a method for forming the patterns on the photomask. To form a phase-shift mask, for example, a phase-shift layer, a chromium film and a resist layer are sequentially formed on a transparent substrate. Then, exposure and development processes are performed on the resist layer using the electron-beam lithography to form a resist pattern. An exposed portion of the chromium film and an exposed portion of the phase shift layer are sequentially removed using the resist pattern as an etch mask to form a phase shift pattern and a chromium pattern. Thereafter, the resist pattern is removed. The chromium pattern is also removed from regions except the frame region.

When the electron beam lithography process is used to form the pattern on the photomask, it is difficult to apply the resist uniformly on an entire surface of a wafer. Non-uniform application of the resist decreases uniformity of a critical dimension (CD) over the locations in the wafer, and thus decreases the productivity of the wafer. In addition, a physical limitation of the lithography equipment imposes limitation on accuracy of forming the pattern, and instability of the lithography process causes a variety of pattern defects. Accordingly, an additional process for correcting the defects is necessarily required. Furthermore, after the process for removing the resist layer, unnecessary impurities tend to remain, which may be a major cause of pattern defects.

SUMMARY

Embodiments of the present invention are directed to a method for forming a photomask using a polymer instead of a photoresist to prevent problems caused during a lithography process.

In one embodiment, a method for fabricating a photomask includes forming a light blocking layer on a transparent substrate having a first region and a second region, forming a hard mask layer on the light blocking layer and forming a first polymer film on the hard mask layer. The first polymer film is formed of single strand polymers that can undergo complementary binding. The method further includes changing a portion of the first polymer film in the first region to have partial complementary binding and forming a hard mask pattern for exposing a portion of the light blocking layer under the first polymer film by performing an etching process using the changed portion of the first polymer film as an etch stop layer. A light blocking pattern is formed by removing an exposed portion of the light blocking layer by performing an etching process using the hard mask pattern as an etch mask and removing the hard mask pattern.

In another embodiment, a method for fabricating a photomask includes forming a phase shift layer and a light blocking layer on a transparent substrate having a first region and a second region, forming a hard mask layer on the light blocking layer and forming a first polymer film on the hard mask layer. The first polymer film is formed of single strand polymers that can undergo complementary binding. The method includes changing a portion of the first polymer film in the first region to comprise polymers having partial complementary binding, and forming a hard mask pattern for exposing a portion of the light blocking layer under the first polymer film by performing an etching process. A blocking pattern and a phase shift pattern are formed by sequentially removing an exposed portion of the light blocking layer and an exposed portion of the phase shift layer by performing an etching process using the hard mask pattern as an etch mask. The hard mask pattern and the light blocking pattern are formed.

The hard mask layer may be formed of gold.

The single strand polymer forming the first polymer film may have a structure where an end is replaced by a component reacting with a component of the hard mask layer.

The hard mask layer may include a composition of gold, and an end of the single strand polymer forming the first polymer film may be replaced by sulfur.

The single strand polymer forming the first polymer film may include a stem region having a thymine-thymine sequence structure, and a loop region having a DNA oligomer structure without the thymine-thymine sequence structure.

The polymer having partial complementary binding may include a stem region having partial complementary binding, and a loop region having a hairpin structure.

The changing of the portion of the first polymer film may include causing a dimerization in the polymers a second portion of the first polymer film corresponding to the second region by irradiating ultraviolet selectively to the second portion; and changing the polymers in the first region to the polymers having partial complementary binding by performing a washing and a heat treatment.

The washing may be performed using a washing solution of a neutral hydrogen ion concentration.

The washing may be performed using a physiological salt solution or a tris-chloride (tris-Cl) aqueous solution as a washing solution.

The heat treatment may be performed by increasing temperature slowly from a room temperature to a temperature ranging from approximately 70° C. to approximately 150° C., and then decreasing the temperature slowly to the room temperature.

The method may further include removing the first polymer film after the forming of the hard mask pattern.

The removing of the first polymer film may be performed by an ozone plasma ashing.

DESCRIPTION OF SPECIFIC EMBODIMENTS

Hereinafter, a method for fabricating a photomask in accordance with the present invention will be described in detail with reference to the accompanying drawings.

Figure 6:
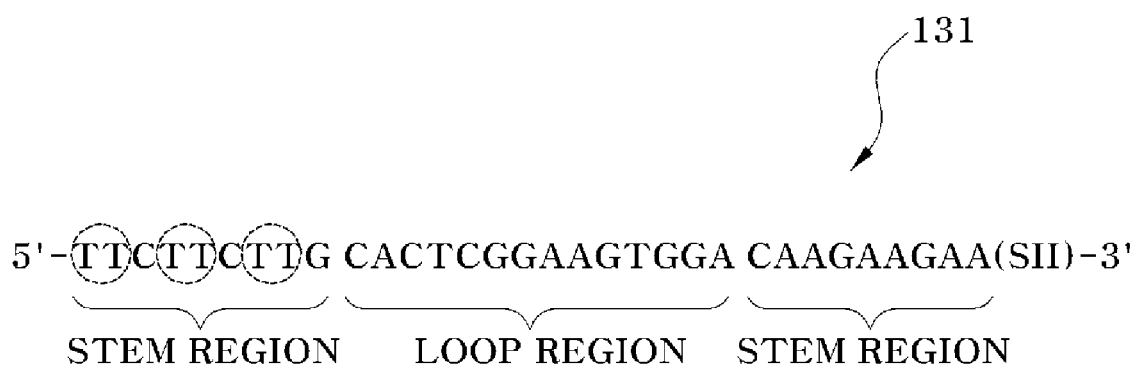
FIG. 6 illustrates a single strand polymer that can form a complementary binding.
Figure 7:
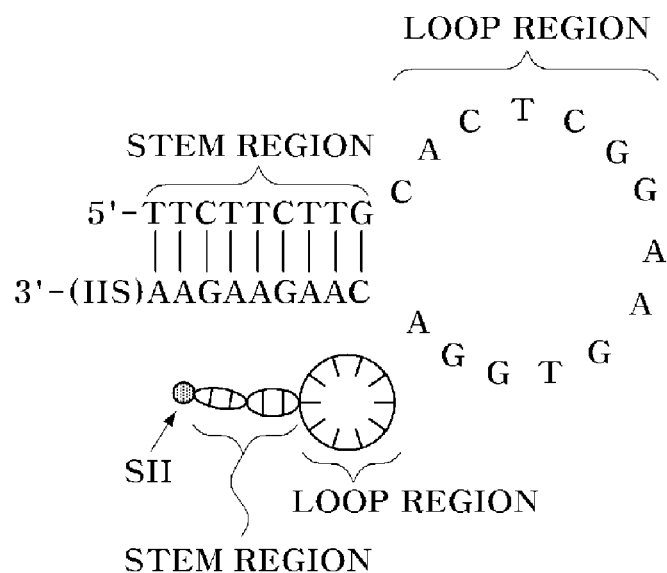
FIG. 7 illustrates a polymer having a deformed structure with a partial complementary binding.

FIGS. 1 to 5 illustrate a method for fabricating a binary photomask according to one embodiment of the present invention with cross-sectional views. FIG. 6 illustrates a single strand polymer that can undergo complementary binding. FIG. 7 illustrates a polymer having partial complementary binding.

Figure 1:
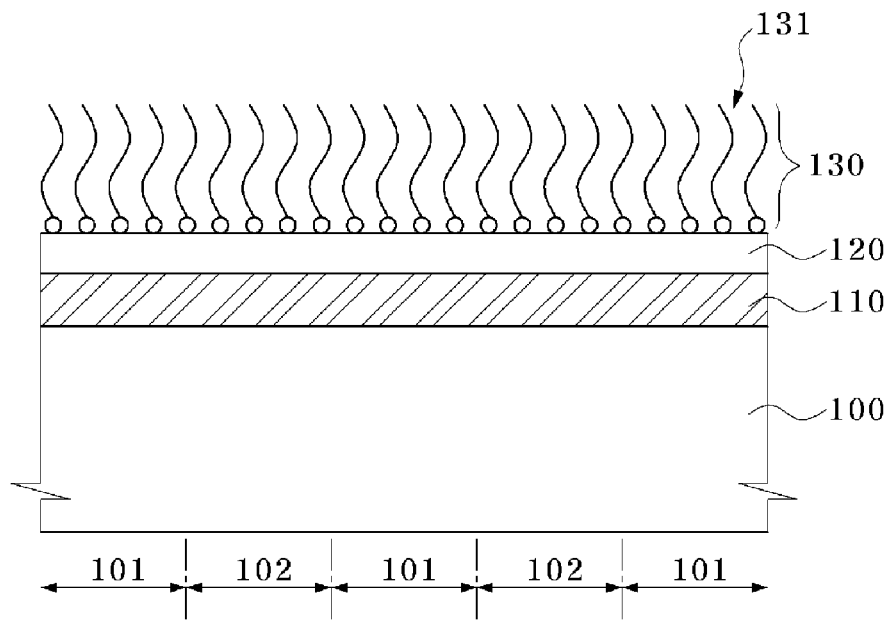
FIGS. 1 to 5 illustrate a method for fabricating a binary photomask according to one embodiment of the present invention with cross-sectional views.

Referring to FIG. 1, a light blocking layer is formed on a transparent substrate 100 having a first region 101 and a second region 102. The first region 101 is a light blocking region and the second region 102 is a light transmission region. The transparent substrate 100 may be formed of, for example, quartz, and the light blocking layer 110 may be formed of, for example, chromium. A hard mask layer 120 is formed on the light blocking layer 110. The hard mask layer 120 is formed of a material that can induce adsorption of a first polymer film thereonto. The hard mask layer 120 may be formed of, for example, gold. The first polymer film 130 is formed on the hard mask layer 120. The first polymer film 130 comprises single strand polymers 131 that can undergo complementary binding.

For example, the single strand polymers 131 that can undergo complementary binding may be a single strand DNA oligomer. Referring to FIG. 6, the single strand DNA oligomer 131 includes a stem region connected to a 3' end or a 5' end, and a loop region connected between the stem regions. The stem region connected to the 3' end and the stem region connected to the 5' end have bases that can undergo complementary pairing (binding) with each other. In one embodiment, the 3' end is replaced by a component reacting with a component of the hard mask layer 120 for adsorption of the DNA oligomer onto the hard mask layer 120. For example, if the hard mask layer 120 is formed of gold, the 3' end of the DNA oligomer is replaced by sulfur (SH). One of the stem regions, for example, the stem region connected to the 5' end, includes a thymine-thymine (TT) base sequence, whereas the loop region does not include the thymine-thymine (TT) base sequence. The loop region is a region shown in a circle in FIG. 6. In a subsequent ultraviolet (UV) irradiation, the stem region including thymine-thymine (TT) base sequence undergoes dimerization so that the stem region does not hybridize (undergo complementary binding) under a certain condition.

Figure 2:
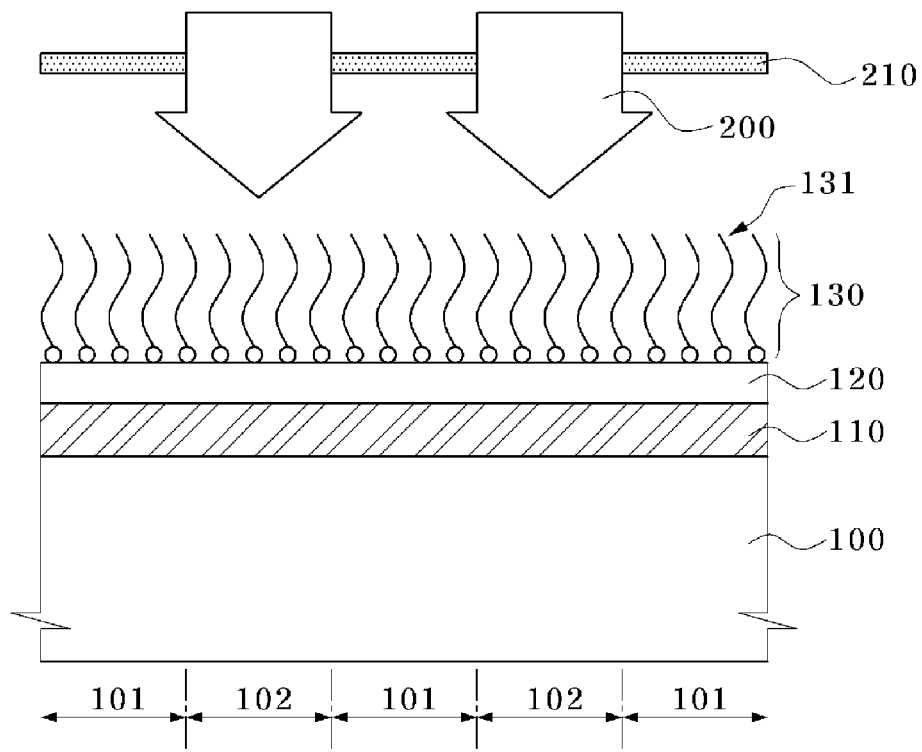

Referring to FIG. 2, ultraviolet (UV) 200 is irradiated on the first polymer film 130. Here, the ultraviolet (UV) 200 is irradiated selectively only on the single strand polymers 131 in the second region 102 (the light transmission region). In one embodiment, a shield mask 210 may be used to shield the single strand polymers 131 in the first region 101 (light blocking region) from light, and expose the single strand polymers 131 in the second region 102 to light. The ultraviolet (UV) irradiation causes thymine-thymine dimerization in the single strand polymers 131 in the second region 102, making the stem region of the single strand polymers 131 unstable. As a result, the single strand polymers 131 in the second region 102 do not undergo complementary binding in a subsequent process.

Figure 3:
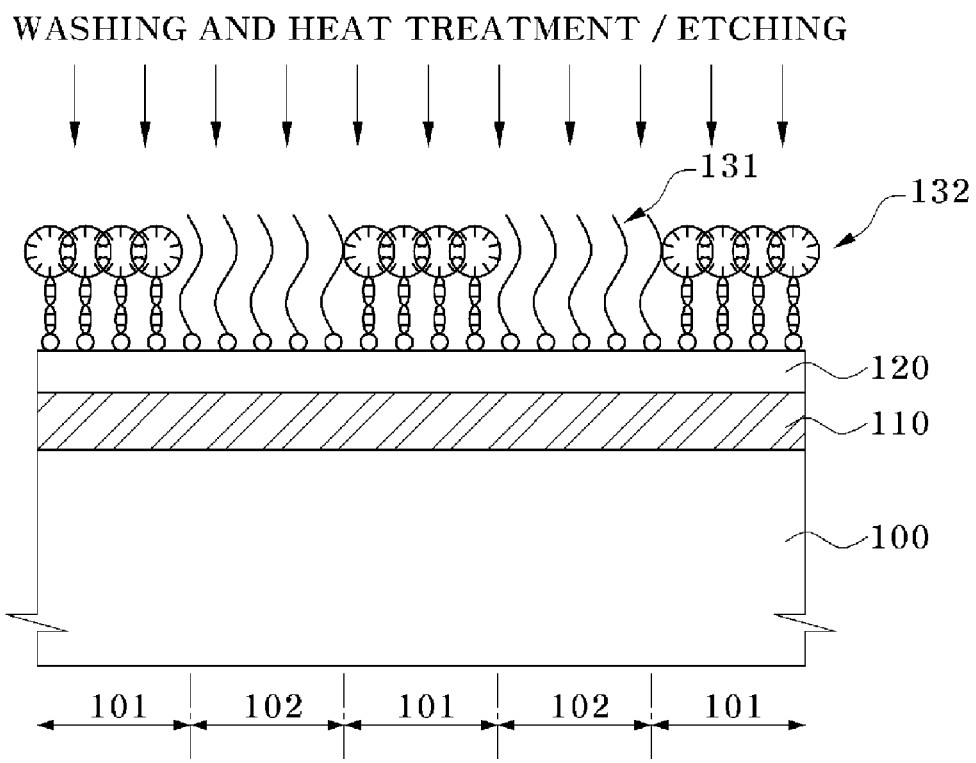

Referring to FIG. 3, a washing and a heat treatment are performed to induce complementary binding in a portion of the single strand polymers 131. In one embodiment, the washing is performed by using a washing solution of a neutral hydrogen ion concentration (pH). For example, a physiological salt solution may be used as the washing solution. 10 mM tris-chloride (tris-Cl) aqueous solution having a hydrogen ion concentration (pH) of approximately 7.2 may also be used as the washing solution. In this case, 100 mM NaCl and 20 mM $MgCl_2$ may be used as additives. The heat treatment is performed by increasing temperature slowly from a room temperature to a temperature ranging from approximately 70° C. to approximately 150° C., and then decreasing the temperature slowly to the room temperature. Through the washing and the heat treatment, the single strand polymers in the first region 101 (the light blocking region) where the ultraviolet (UV) has not been irradiated are changed into polymers 132 having partial complementary binding. On the contrary, the single strand polymers 131 in the second region 102 where the ultraviolet (UV) has been irradiated do not undergo complementary binding because of the thymine-thymine dimerization caused by the ultraviolet (UV) irradiation. As such, due to the thymine-thymine dimerization, the single strand polymers 131 in the second region 102 still remain intact after the washing and the heat treatment.

As shown in FIG. 7, the polymers 132 having partial complementary binding have the stem regions and the loop region. Here, the stem region connected to the 5' end hybridizes with the stem region connected to the 3' end. The loop region has a hair pin structure where the bases are arranged in a circle without complementary binding. The polymers 132 having partial complementary binding have a higher thermodynamic stability than the single strand polymers 131. Such a difference in the thermodynamic stability results in a difference in an etch rate. That is, the polymers 132 having partial complementary binding has a relatively high thermodynamic stability, and thus shows a relatively low etch rate in comparison with the single strand polymers 131.

Figure 4:
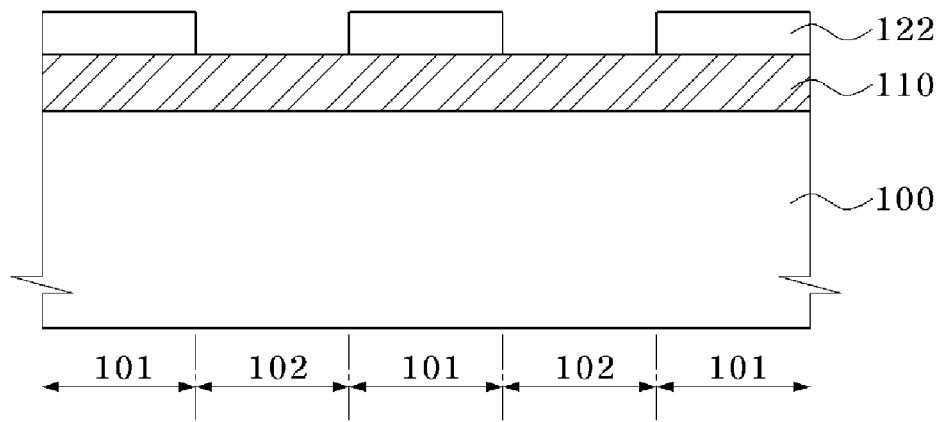

In one embodiment, through the washing and the heat treatment, the polymers 132 having partial complementary binding are formed in the first region 101 of the light blocking region, and the single strand polymers 131 are formed in the second region 102 of the light transmission region. Thereafter, an etching process is performed using a dry etching or a wet etching. As described above, the polymer 132 having partial complementary binding has a higher thermodynamic stability and thus shows a lower etch rate than the single strand polymer 131. Therefore, a portion of the hard mask layer 120 in the second region 102 where the single strand polymers 131 are formed is removed through the etching process. However, the other portion of the hard mask layer 120 in the first region 101 is not etched because the polymers 132 having partial complementary binding are formed thereon to serve as an etch stop layer. As shown in FIG. 4, a hard mask pattern 122 is formed on the light blocking layer 110 to expose a portion of the light blocking layer 110 in the second region. After the hard mask pattern 122 is formed, the single strand polymers 131 and the polymers 132 may be removed thoroughly during the etching process. In some embodiments, an additional removal process, such as an ozone ($O_3$) plasma ashing, may be performed to remove them.

Figure 5:
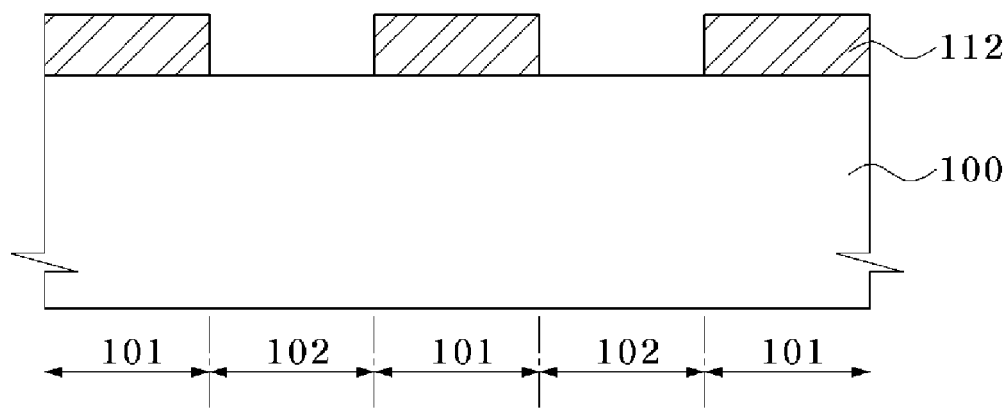

Afterwards, referring to FIG. 5, another etching process is performed on the exposed portion of the light blocking layer 110 using the hard mask pattern 122 as an etch mask. Then, a light blocking pattern 112 is formed on the transparent substrate 100 to expose a portion of the transparent substrate 100 in the second region 102 of the light transmission region. After that, the hard mask pattern 122 is removed to form a binary photomask for covering a portion of the transparent substrate 100 with the light blocking pattern 112 in the first region 101 of the light blocking region and exposing the other portion of the transparent substrate 100 in the second region 102 of the light transmission region.

FIGS. 8 to 13 illustrate a method for fabricating a phase shift photomask according to another embodiment of the present invention with cross-sectional views.

Figure 8:
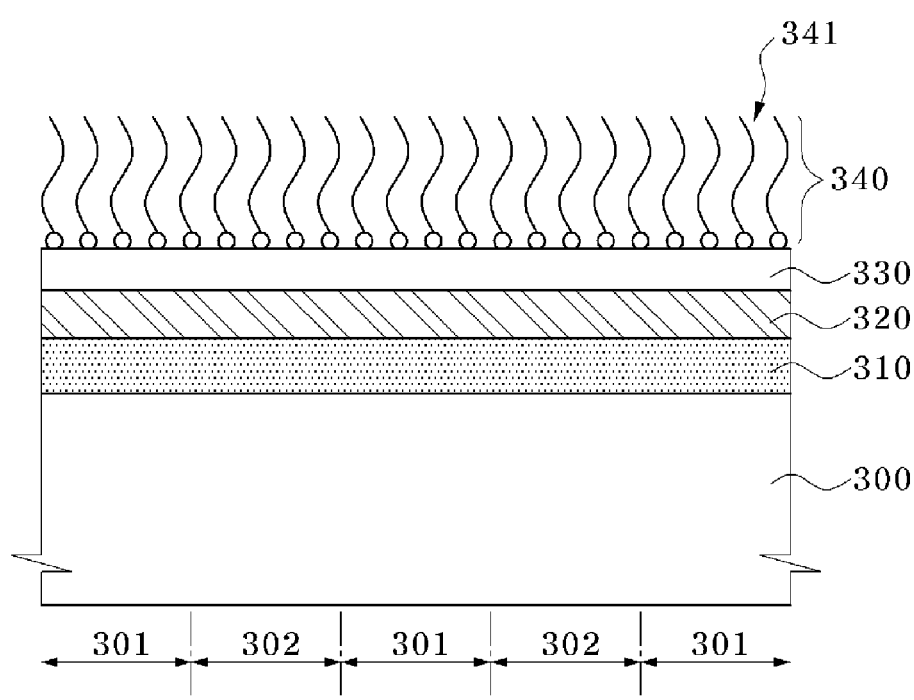
FIGS. 8 to 13 illustrate a method for fabricating a phase shift photomask according to another embodiment of the present invention with cross-sectional views.

Referring to FIG. 8, a phase shift layer 310 and a light blocking layer 320 are sequentially formed on a transparent substrate 300 including a first region 301 and a second region 302. The first region 301 is a phase shift region and the second region 302 is a light transmission region. The transparent substrate 300 may be formed of, for example, quartz. The phase shift layer 310 may be formed of, for example, molybdenum silicon. The light blocking layer 320 may be formed of, for example, chromium. A hard mask layer 330 is formed on the light blocking layer 320. The hard mask layer 330 is formed of a material that can induce adsorption of a first polymer film 340 thereonto. The hard mask layer 330 may be formed of, for example, gold. The first polymer film 340 is formed on the hard mask layer 330. The first polymer film 340 is formed of single strand polymers 341 that can undergo complementary binding. The single strand polymer 341 may be, for example, a single strand DNA oligomer.

As with FIG. 6, the single strand DNA oligomer includes a stem region connected to a 3' end, a stem region connected to a 5' end, and a loop region connected between the stem regions. The stem region connected to the 3' end and the stem region connected to the 5' end have bases that can undergo complementary paring with each other. The 3' end is replaced by a component reacting with a component of the hard mask layer 330 for adsorption of the DNA oligomer onto the hard mask layer 330. For example, if the hard mask layer 330 is formed of gold, the 3' end of the DNA oligomer is replaced by sulfur (SH). One of the stem regions, for example, the stem region connected to the 5' end, includes a thymine-thymine (TT) base sequence, whereas the loop region does not include the thymine-thymine (TT) base sequence.

Figure 9:
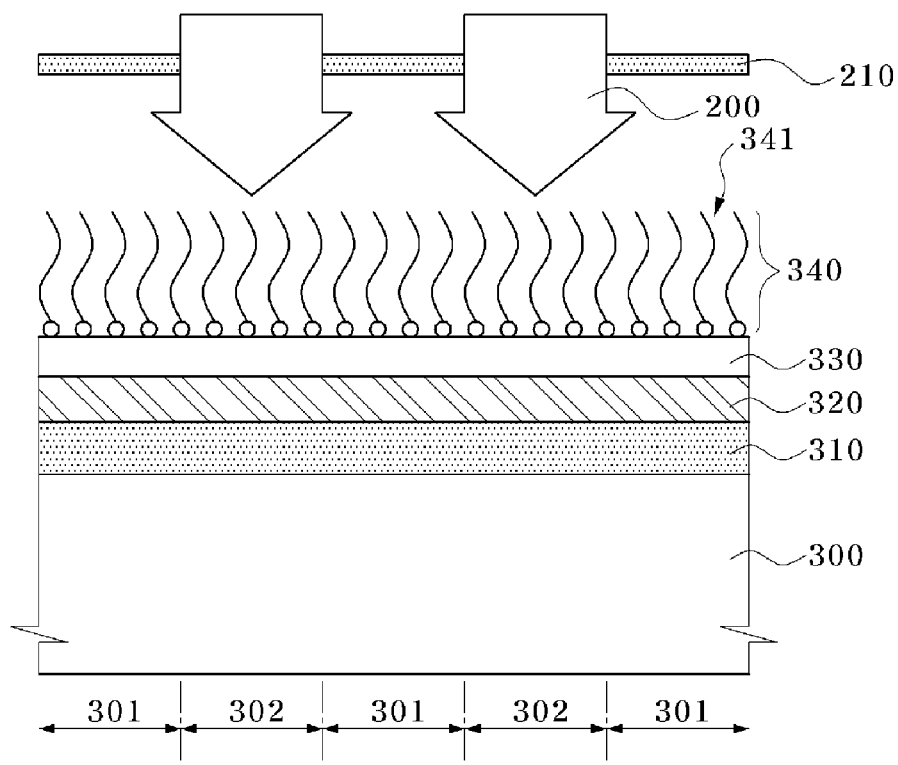

Referring to FIG. 9, ultraviolet (UV) 200 is irradiated on the first polymer film 340. Here, the ultraviolet (UV) 200 is irradiated selectively only on the single strand polymers 341 in the second region 302. In one embodiment, a shield mask 210 may be used to shield the single strand polymers 341 in the first region 301 (the light blocking region) from light, and to expose the single strand polymers 341 in the second region 302 (the light transmission region) to light. The ultraviolet (UV) irradiation 200 causes thymine-thymine dimerization in the single strand polymers 341 in the second region 302, making the stem regions of the single strand polymers 341 unstable. Due to the thymine-thymine dimerization, the single strand polymers 341 in the second region 302 do not undergo complementary binding in a subsequent process such as washing and a heat treatment processes.

Figure 10:
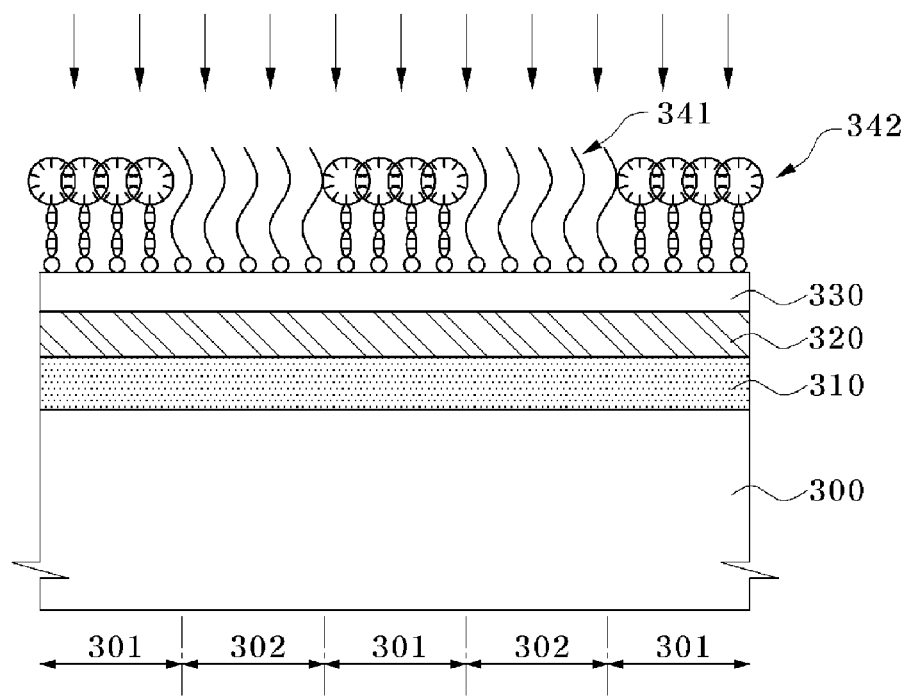

Referring to FIG. 10, a washing and a heat treatment are performed to induce complementary binding of a portion of the single strand polymers 341. In one embodiment, the washing is performed by using a washing solution of a neutral hydrogen ion concentration (pH). A physiological salt solution may be used as the washing solution. 10 mM tris-chloride (tris-Cl) aqueous solution having a hydrogen ion concentration (pH) of approximately 7.2 may also be used as the washing solution. In this case, 100 mM NaCl and 20 mM $MgCl_2$ may be used as additives. The heat treatment is performed by increasing temperature slowly from a room temperature to a temperature ranging from approximately 70° C. to approximately 150° C., and then decreasing the temperature slowly to the room temperature. Through the washing and the heat treatment, the single strand polymers in the first region 301 (the light blocking region) where the ultraviolet (UV) has not been irradiated are changed into polymers 342 having a deformed structure with partial complementary binding. On the contrary, the single strand polymers in the second region 302 where the ultraviolet (UV) has been irradiated do not undergo complementary binding because of the thymine-thymine dimerization caused by the ultraviolet (UV) irradiation. Accordingly, the single strand polymers in the second region 302 still remain intact after the washing and the heat treatment.

The polymers 342 having partial complementary binding include a hair pin structure, as described above with reference to FIG. 7. That is, the stem region connected to the 5' end hybridizes with the stem region connected to the 3' end, whereas the loop region has a structure where the bases are arranged in a circle and thus does not undergo complementary binding. The polymers 342 have a higher thermodynamic stability than the single strand polymers 341. Such a difference in the thermodynamic stability results in a difference in an etch rate. That is, the polymers 342 have a relatively high thermodynamic stability, and thus show a relatively low etch rate in comparison with the single strand polymers 341.

Figure 11:
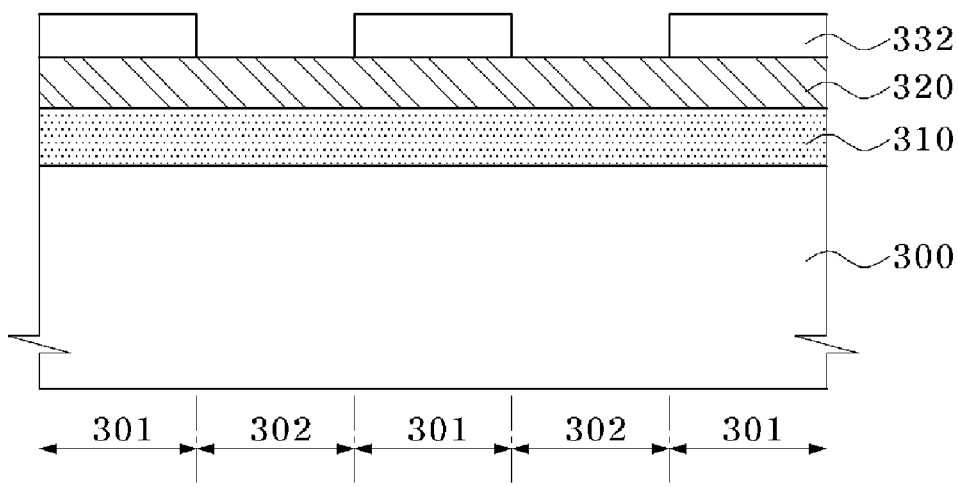

In one embodiment, through the washing and the heat treatment, the polymers 342 having partial complementary binding are formed in the first region 301, and the single strand polymers 341 are formed in the second region 302. Thereafter, an etching process is performed using a dry etching or a wet etching. As described above, the polymers 342 having partial complementary binding has a higher thermodynamic stability and thus shows a lower etch rate than the single strand polymers 341. Therefore, a portion of the hard mask layer 330 in the second region 302 where the single strand polymers 341 are formed is removed through the etching process while the other portion of the hard mask layer 330 in the first region 301 is not etched because the polymers 342 having partial complementary binding are formed thereon to serve as an etch stop layer. As shown in FIG. 11, a hard mask pattern 332 is formed on the light blocking layer 320 to expose a portion of the light blocking layer 320 in the second region 302. After the hard mask pattern 332 us formed, the single strand polymers 341 and the polymers 342 may be removed during the etching process. In some embodiment, an additional removal process, such as an ozone ($O_3$) plasma ashing, may be performed to remove them.

Figure 12:
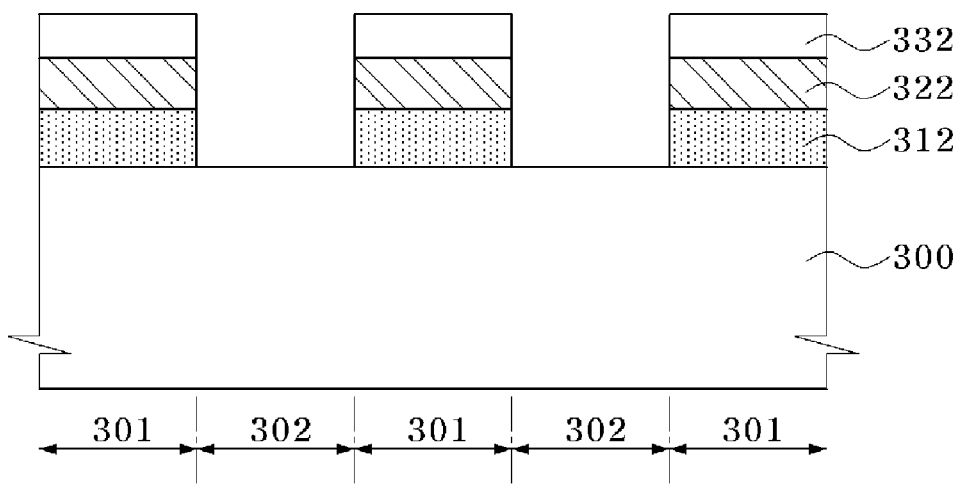

Afterwards, referring FIG. 12, another etching process is performed on the exposed portion of the light blocking layer 320 using the hard mask pattern 332 as an etch mask to form a light blocking pattern 322 for exposing a portion of the phase shift layer 310 in the second region 302. Then, an etching process is performed on the exposed portion of the phase shift layer 310 to form a phase shift pattern 312 for exposing a portion of the transparent substrate 300 in the second region 302 of the light transmitting region.

Figure 13:
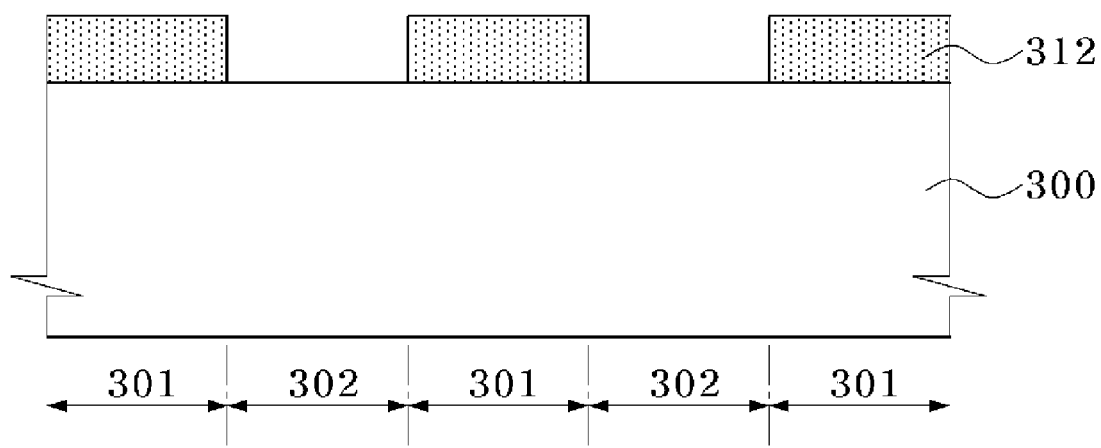

Referring to FIG. 13, after forming the light blocking pattern 322 and the phase shift pattern 312, the hard mask pattern 332 is removed, and then, the light blocking pattern 332 is also removed. As such, the phase shift pattern 312 is formed in the first region 301 of the light blocking region, and the phase shift photomask for exposing the transparent substrate 300 is formed in the second region 302 of the light transmission region. Although not shown, a portion of the light blocking pattern 322 may remain in the frame region (not shown) of the phase shift photomask.

As described above, patterning is performed using the etch rate difference caused by thermodynamic stability difference between the single strand polymer and the polymer having partial complementary binding. As such, the patterning does not require a resist layer and a lithography process. Therefore, it is possible to prevent a variety of problems described above, such as a non-uniformity of the photoresist application and a pattern defect, caused by processes for applying and removing the resist layer, a lithography process, and lithography equipments.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a photomask, the method comprising:
    forming a light blocking layer on a transparent substrate having a first region and a second region;
    forming a hard mask layer on the light blocking layer;
    forming a first polymer film on the hard mask layer, the first polymer film being formed of single strand polymers that can undergo complementary binding;
    changing the first polymer film in the first region to a second polymer film comprising polymers having partial complementary binding, thereby the second polymer film in the first region has a different etch rate than that of the first polymer film in the second region;
    forming a hard mask pattern for exposing a portion of the light blocking layer under the first polymer film in the second region by performing an etching process on the hard mask layer in the first region and the second region using the etch rate difference between the first polymer film in the second region and the second polymer film in the first region;
    forming a light blocking pattern by removing an exposed portion of the light blocking layer by performing an etching process using the hard mask pattern as an etch mask; and
    removing the hard mask pattern.

2. The method of claim 1, wherein the hard mask layer is formed of gold.

3. The method of claim 1, wherein the single strand polymer forming the first polymer film has a structure where an end is replaced by a component reacting with a component of the hard mask layer.

4. The method of claim 3, wherein the hard mask layer comprises a composition of gold and an end of the single strand polymer forming the first polymer film is replaced by sulfur.

5. The method of claim 1, wherein the single strand polymer forming the first polymer film comprises a stem region including a thymine-thymine sequence structure, and a loop region having a DNA oligomer structure without the thymine-thymine sequence structure.

6. The method of claim 1, wherein a polymer having partial complementary binding comprises a stem region having partial complementary binding, and a loop region having a hairpin structure.

7. The method of claim 1, wherein the changing of the first polymer film in the first region to the second polymer film comprises:
    causing a dimerization in the first polymer film in the second region by irradiating ultraviolet selectively on the second region; and
    performing a washing and a heat treatment to change the first polymer film in the first region to the second polymer film undergoing partial complementary binding.

8. The method of claim 7, wherein the washing is performed using a washing solution of a neutral hydrogen ion concentration.

9. The method of claim 7, wherein the washing is performed using a physiological salt solution or a tris-chloride (tris-Cl) aqueous solution as a washing solution.

10. The method of claim 7, wherein the heat treatment is performed by increasing temperature slowly from a room temperature to a temperature ranging from approximately 70° C. to approximately 150° C., and then decreasing the temperature slowly to the room temperature.

11. The method of claim 1, further comprising removing the first polymer film in the second region and the second polymer film in the first region after the forming of the hard mask pattern.

12. The method of claim 11, wherein the removing of the first polymer film in the second region and the second polymer film in the first region is performed by an ozone plasma ashing.

13. A method for fabricating a photomask, the method comprising:
    forming a phase shift layer and a light blocking layer on a transparent substrate having a first region and a second region;
    forming a hard mask layer on the light blocking layer;
    forming a first polymer film on the hard mask layer, the first polymer film being formed of single strand polymers that can undergo complementary binding;
    changing the first polymer film in the first region to a second polymer film comprising polymers having partial complementary binding, thereby the second polymer film in the first region has a different etch rate than that of the first polymer film in the second region;

forming a hard mask pattern for exposing a portion of the light blocking layer under the first polymer film in the second region by performing an etching process on the hard mask layer in the first region and the second region using the etch rate difference between the first polymer film in the second region and the second polymer film in the first region;

forming a light blocking pattern and a phase shift pattern by sequentially removing an exposed portion of the light blocking layer and an exposed portion of the phase shift layer by performing an etching process using the hard mask pattern as an etch mask; and removing the hard mask pattern and the light blocking pattern.

14. The method of claim 13, wherein the hard mask layer is formed of gold.

15. The method of claim 13, wherein the single strand polymer forming the first polymer film has a structure where an end is replaced by a component reacting with a component of the hard mask layer.

16. The method of claim 13, wherein the hard mask layer comprises a composition of gold and an end of the single strand polymer forming the first polymer film is replaced by sulfur.

17. The method of claim 13, wherein the single strand polymer forming the first polymer film comprises a stem region including a thymine-thymine sequence structure, and a loop region having a DNA oligomer structure without the thymine-thymine sequence structure.

18. The method of claim 13, wherein the polymer having partial complementary binding comprises a stem region having partial complementary binding, and a loop region having a hairpin structure.

19. The method of claim 13, wherein the changing of the first polymer film in the first region to the second polymer film comprises:

causing a dimerization in the first polymer film in the second region by irradiating ultraviolet selectively on the second region; and changing the first polymer film in the first region to the second polymer film having partial complementary binding by performing a washing and a heat treatment.

20. The method of claim 19, wherein the washing is performed using a washing solution of a neutral hydrogen ion concentration.

21. The method of claim 19, wherein the washing is performed using a physiological salt solution or a tris-chloride (tris-Cl) aqueous solution as a washing solution.

22. The method of claim 19, wherein the heat treatment is performed by increasing temperature slowly from a room temperature to a temperature ranging from approximately 70° C. to approximately 150° C., and then decreasing the temperature slowly to the room temperature.

23. The method of claim 13, further comprising removing the first polymer film in the second region and the second polymer film in the first region after the forming of the hard mask pattern.

24. The method of claim 23, wherein the removing of the first polymer film in the second region and the second polymer film in the first region is performed by an ozone plasma ashing.

25. The method of claim 18, wherein the second polymer film in the first region has a lower etch rate than the first polymer film in the second region.

* * * * *

```
SEQUENCE LISTING

<160> NUMBER OF SEQ ID NOS: 1

<210> SEQ ID NO 1
<211> LENGTH: 32
<212> TYPE: DNA
<213> ORGANISM: Artificial
<220> FEATURE:
<223> OTHER INFORMATION: single strand nucleotide polymer with partial
      complementarity

<400> SEQUENCE: 1
ttcttcttgc actcggaagt ggacaagaag aa                                    32
```